(12) United States Patent
Koide

(10) Patent No.: US 6,448,997 B1
(45) Date of Patent: Sep. 10, 2002

(54) LASER BEAM SCANNING SYSTEM AND METHOD USING A PHOTONIC CRYSTAL

(75) Inventor: Hiroshi Koide, Yamato (JP)

(73) Assignee: Ricoh Company, Ltd., Tokyo (JP)

( * ) Notice: Subject to any disclaimer, the term of this patent is extended or adjusted under 35 U.S.C. 154(b) by 48 days.

(21) Appl. No.: 09/648,732

(22) Filed: Aug. 25, 2000

(30) Foreign Application Priority Data

Sep. 2, 1999 (JP) .......................................... 11-248877

(51) Int. Cl.$^7$ ............................................... B41J 2/435
(52) U.S. Cl. ................................... 347/250; 347/235
(58) Field of Search ................................. 347/235, 236, 347/237, 246, 247, 250, 243, 256; 359/237, 245; 372/33, 96, 20, 18, 50; 345/255, 256, 239, 241, 250, 235

(56) References Cited

U.S. PATENT DOCUMENTS

| | | | | |
|---|---|---|---|---|
| 5,204,694 A | * | 4/1993 | Andrews | 347/256 |
| 5,461,412 A | * | 10/1995 | Paoli et al. | 347/243 |
| 5,825,793 A | * | 10/1998 | Miyai et al. | 372/33 |
| 5,838,714 A | * | 11/1998 | Delorme | 372/96 |
| 6,052,213 A | * | 4/2000 | Burt et al. | 359/237 |

OTHER PUBLICATIONS

Optics 24th Symp. Proc. 17–18 (1999).
Oki Electronic Industry, R & D Reports, vol. 54, No. 1, 31–38 (1997).
Optronics No. 4, 164–169 (1999).
Optics 24th Symp. Proc. 49–50 (1999).
Oyo Butsuri vol. 59, No. 9, 6–23 (1990).
Optronics, No. 5, 136–141 (1999).
Optical Review, vol. 1, 227–229 (1994).

* cited by examiner

Primary Examiner—Hai Pham
(74) Attorney, Agent, or Firm—Cooper & Dunham LLP

(57) ABSTRACT

A laser scanning system including a wavelength tunable laser generating and emitting a laser beam having tunable wavelengths, and at least one photonic crystal receiving the laser beam emitted from the wavelength tunable laser. The photonic crystal deflects the received laser beam, during propagation within the photonic crystal, at an angle depending on the wavelength of the laser beam, and emits the deflected laser beam at various angles of emission depending on the angle deflected in the photonic crystal to scan the laser beams over the surface area of a body to be scanned. Non-linearities found in the wavelength versus scanning beam position relation are corrected with position sensors provided at both ends, and in between positions, of the beam scanning range on the photosensitive drum. With this configuration of the position sensors, the non-linearities are corrected and also beam scanning with high precession becomes feasible.

27 Claims, 3 Drawing Sheets

WAVELENGTH CONTROL
REGION CURRENT It (mA)

LASER BEAM SCANNING SYSTEM AND METHOD USING A PHOTONIC CRYSTAL

BACKGROUND

1. Field

This patent specification relates to a laser beam scanning system, and more particularly to a beam scanning system in use for Carlson-type image recording, having a reduced size, power consumption, costs and operation noise, and achieving excellent image quality and high scan speeds.

2. Discussion of the Background

As an exemplary method of laser beam scanning, a method using a rotating polygonal mirror is well known, and appears to continue as a viable means for achieving duplication and printing with excellent image quality and high turnaround speeds. It is noted, however, the method has drawbacks to solve such as, for example, reduction in size, costs and noise during operation. In order to attain higher speeds, several methods employing multi-beams have been investigated (as exemplified by, for example, Optics 24th Symp. Proc. 17–18 (1999)).

Another method of laser beam scanning is also known which utilizes a light emitting device (LED) array. This method has been developed and put into market primarily in order to reduce the machine size. Although it has not been recognized as the mainstay of scanning systems, efforts continue to implement it as one of the ideal forms of the system. The efforts at present are focused on higher image quality and reduced costs. Although LED devices, as the constituents of the array, preferably have to be zero in defect and each to have required characteristics, there are still expected various difficulties in achieving these goals with satisfactory production yield. (For example, Oki Electronic Industry, R & D Reports, Vol. 54, No. 1, 31–38 (1997)).

In the scanning system, therefore, further improvements are desirable to implement laser beam scanning system which is, in particular, capable of achieving reciprocal scans transverse to the axial direction of the photosensitive drum. This system is preferably constructed with a reduced size, power consumption, costs and operation noise, still retaining excellent image quality and high turnaround speeds, without incorporating mechanical devices such as, for example, a rotating polygonal mirror.

SUMMARY

Accordingly, it is an object of the present disclosure to provide an improved laser beam scanning system, having most, if not all, of the advantages and features of similar employed systems, while eliminating many of the aforementioned disadvantages.

The following brief description is a synopsis of only selected features and attributes of the present disclosure. A more complete description thereof is found below in the section entitled "Description of Preferred Embodiments".

A laser scanning system disclosed herein includes a wavelength tunable laser generating and emitting a laser beam having tunable wavelengths, and at least one photonic crystal receiving the laser beam emitted from the wavelength tunable laser. The photonic crystal deflects the received laser beam, during propagation within the photonic crystal, at an angle depending on the wavelength of the laser beam, and emits the deflected laser beam at various angles of emission depending on the angle deflected in the photonic crystal to thereby scan the laser beam over the surface area of a body to be scanned.

In another aspect disclosed herein, the non-linearity found in the wavelength versus scanning beam position relation is suitably adjusted with position sensors provided at both ends, and in between positions, of the beam scanning range on the photosensitive member. With this configuration of the position sensors, the above-mentioned non-linearity is compensated, and also beam scanning with high precision becomes feasible.

In still another aspect disclosed herein, a device is provided for varying the angles of emission for a light beam emitted from the device in place of the above noted wavelength tunable laser, which is useful for achieving higher angles of deflection, thereby leading to a more compact construction of the laser beam scanning system.

BRIEF DESCRIPTION OF THE DRAWINGS

Preferred embodiments of the invention are described hereinbelow with reference to the drawings wherein.

DESCRIPTION OF PREFERRED EMBODIMENTS

In the detailed description which follows, specific embodiments of the system particularly useful for laser scanning in for electrophotographic imaging are described. It is understood, however, that the present disclosure is not limited to these embodiments. For example, it is appreciated that a beam scanning system disclosed herein may also be adaptable to use in any form of image formation and position sensing. Other embodiments will be apparent to those skilled in the art upon reading the following description.

A laser scanning system disclosed herein includes a wavelength tunable laser capable of emitting light at tunable wavelengths, and a photonic crystal receiving the laser beam emitted from the wavelength tunable laser and incident on the photonic crystal. During propagation within the photonic crystal, the laser beam is deflected at an angle depending on the wavelength of the laser beam, then emitted at various angles of emission corresponding to the angle deflected in the photonic crystal.

In one embodiment disclosed herein, a wavelength tunable DBR-DC-PBH (distributed Bragg reflector-double channel-planar buried heterostructure) semiconductor laser is used as the wavelength tunable laser, and its wavelength is varied by inputting appropriate wavelength control currents. An electric field absorption modulator is further provided to modulate the amplitude of light beams from the laser.

In addition, at least one position sensor is provided for sensing diffracted laser beams to thereby facilitate controlling the wavelength of the laser beam. Also, another set of position sensors are provided for detecting start and finish positions so as to correct the wavelengths of the laser beam as well as to achieve high quality in resultant images.

In another embodiment disclosed herein, scanning the laser beam is controlled to be reciprocating, and corrections for the differences in scan period, start position and finish position, are carried out over the next several lines, gradually from one line to the next, to obviate irregularities which may otherwise appear in resultant images.

A laser beam scanning system will now be detailed herein below. This scanning system includes at least a wavelength tunable laser 4 and a photonic crystal 1.

Figure 3:
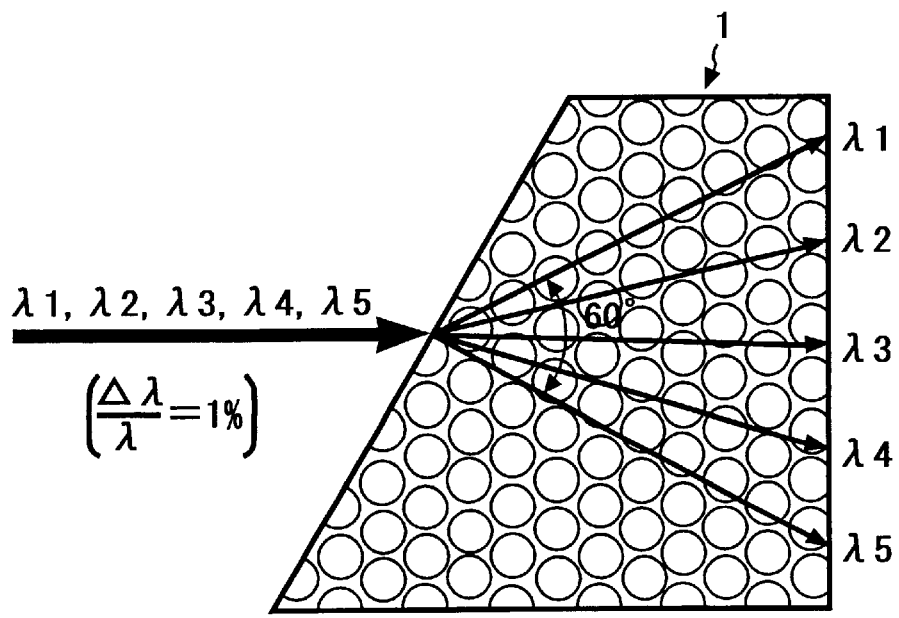
FIG. 3 a schematic view illustrating light deflection characteristics of a photonic crystal disclosed herein.

The photonic crystal 1 is characterized by the property of causing an approximately 60° difference in propagation angle for 1% change in light wavelength (FIG. 3). For example, a difference in propagation angle of 50° is reported for the change in light wavelength from 1 μm to 0.99 μm (i.e., 10 nm change) according to Optronics No. 4, 167 (1999) and Optics 24th Symp. Proc. 49–50 (1999), hereby incorporated by reference herein.

The laser device 4 disclosed herein a wavelength tunable distributed Bragg reflector (DBR) semiconductor laser having an infrared emission (approximately 852 nm). Its wavelengths are varied by currents inputted into a DBR region of the laser. As described in Oyo Butsuri Vol. 59, No. 9, 6 (1990), hereby incorporated by reference herein, the change in wavelength reaches approximately 1% when a maximum change in refractive index is utilized.

For implementing a continuous change in emission wavelengths, a wavelength tunable DBR-DC-PBH (distributed Bragg reflector-double channel-planar buried heterostructure) semiconductor laser may be used, which includes such portions as active, phase control and DBR regions. With this structure, the wavelength is known to vary by up to 4.4 nm with a laser power of 1 mW.

Since the difference in propagation angle is 50° for a change in light wavelength from 1 μm to 0.99 μm, as described earlier, a difference in propagation angle of 42.5° is expected when a 852 nm laser is used and 1% change in its wavelength (i.e., 8.5 nm) is assumed for an optical output from the photonic crystal. In addition, a further decreased value for the change in propagation angle is expected for a 4.4 nm change in wavelength. Although the magnitude of these propagation angle changes is relatively small and may not by itself be entirely satisfactory to reduce the size of the beam scanning system, the effective deflection magnitude can be increased by propagating the beams through at least two photonic crystals (Optics 24th Symp. Proc. 49–50 (1999)), hereby incorporated by reference herein.

Another method of light beam deflection is previously known such as, for example, an acoustoptic (AO) modulator. The AO modulator, however, has a relatively small angle of deflection. When a photonic crystal is provided in addition to the AO modulator, the deflection angle can be increased to thereby make the modulator system capable of scanning a variety of objects to be scanned and scanning is achieved by suitably controlling the frequency used in the AO modulator.

In such methods utilizing photonic crystals, it is necessary to compensate or correct temperature effects as well. This correction may be effected by compensating positional errors caused by the wavelength change through a feedback control. During direct modulation of the semiconductor laser, chirping or frequency variation may result. This may be effectively obviated by using an electric field absorption integrated light source (Optronics, No. 5, 136 (1999)), hereby incorporated by reference herein.

The methods of detecting and controlling wavelengths of laser beams are of primary importance in the scanning system disclosed herein.

Stable control of the laser beams can be achieved by continuously detecting the laser beams, then feeding back resulting signals. A method of wavelength lock in semiconductor laser by means of optical feed back has been investigated (Optical Review, Vol. 1, 227–229 (1994)), hereby incorporated by reference herein. In the method disclosed herein, a sweep operation is made for the wavelength of the laser beams.

The difference in wavelength can be detected with a diffraction grating. After a light beam is transmitted through a diffraction grating, it emerges with different angles depending on the wavelength. The difference in the wavelength can therefore be detected by leading the emerging beam to a half-split photodetector. Alternately, by using a photonic crystal in place of the half-split photodetector, sensitivity to detecting the wavelength difference can increase.

When a photodetector is used for the detection, a large surface area of the photodetector may decrease the frequency range of wavelength detection. A relatively small surface area is therefore preferred, which is implemented by adopting a small photonic crystal, thereby decreasing the path length of the light beam in the photonic crystal.

Figure 1:
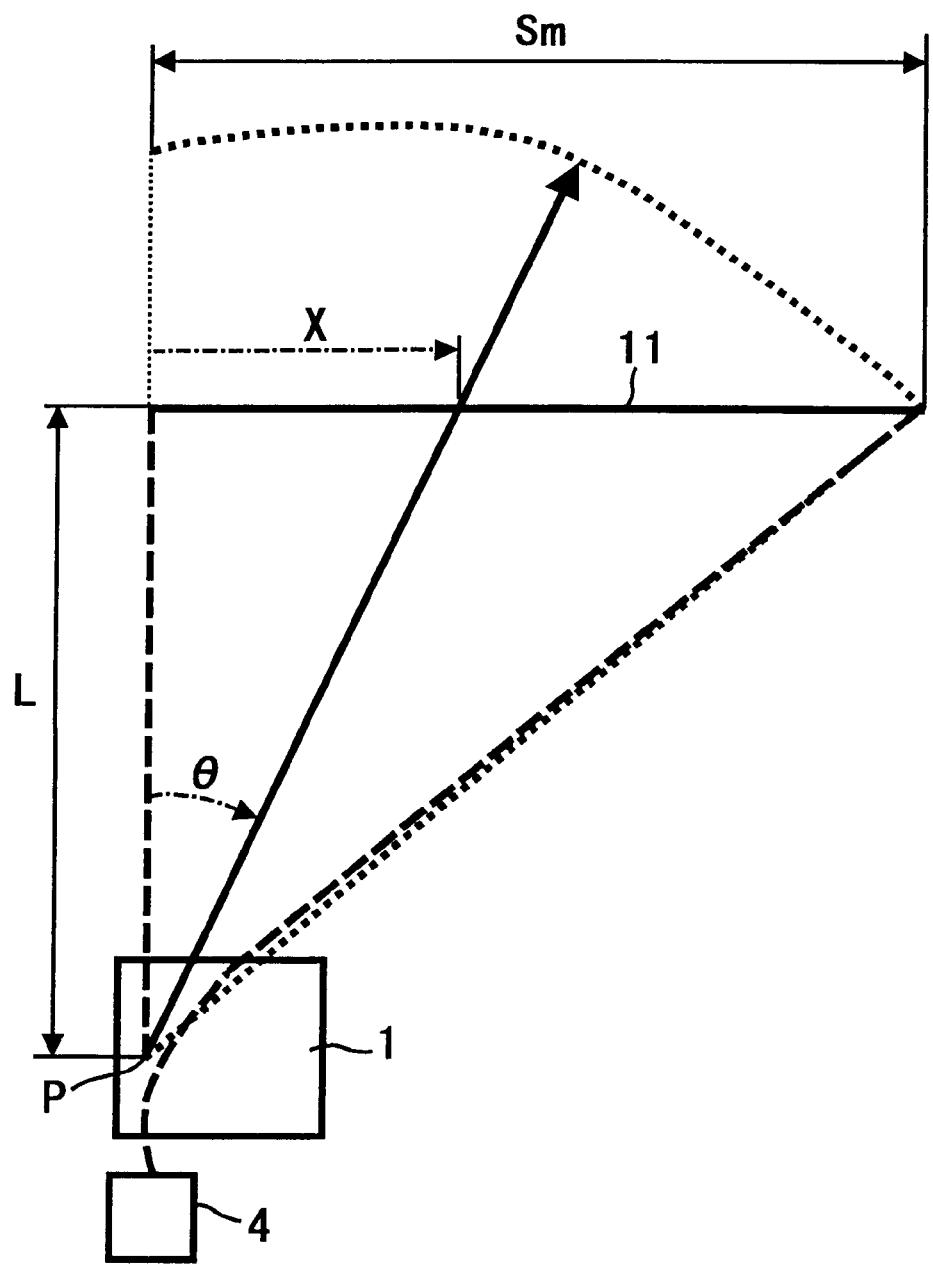
FIG. 1 is a schematic view illustrating a relationship between wavelength and time for scanning a light beam at a constant velocity over the surface area of a photosensitive member.

A position sensitive detector (PSD) can be used in place of the half-split photodetector. The location for the detection is preferably selected such that the device is located before the electric field absorption integrated modulator, which is carried out by splitting the light beam using a mirror or grating. With this configuration, fluctuation of the amplitude of the light beam, which may be enhanced by an integrated modulator, can be decreased, Referring now to FIG. 1, a relationship is examined between wavelength and time for scanning a light beam at a constant velocity over the area of a photosensitive member 11 such as a PC drum.

A light beam is deflected during the passage through the photonic crystal 1, and a virtual point source p is assumed for the light beam at a position x of the scanned light beam on the drum 11.

$$x = L \times \tan\theta \tag{1}$$

When a constant linear velocity v is assumed for the beam scan, the position x is expressed by $$x = v \times t. \tag{2}$$

With a substitution $$v/L = \tau \tag{3}$$

the following equation is obtained from (1) and (2), as $$\theta = \arctan(\tau t). \tag{4}$$

For a wavelength λ of the light beam and from the characteristic of the photonic crystal, the following approximated relation between wavelength λ and position x is obtained $$\theta = f(\lambda) = k\lambda. \tag{5}$$

Also obtained from (4) and (5) is the relation $$\lambda = 1/k \times \arctan(\tau t). \tag{6}$$

The relation between the two valuables λ and t, which is satisfied to attain a constant velocity for scanning a light beam over the surface area of photosensitive drum 11, is therefore non-linear, as expressed by equation (6). After comparing detected wavelength signals with reference signals generated according to the relation (6) to find the difference therebetween, the difference of the beam scan can be corrected by inputting compensating currents corresponding to the difference obtained above.

Figure 4:
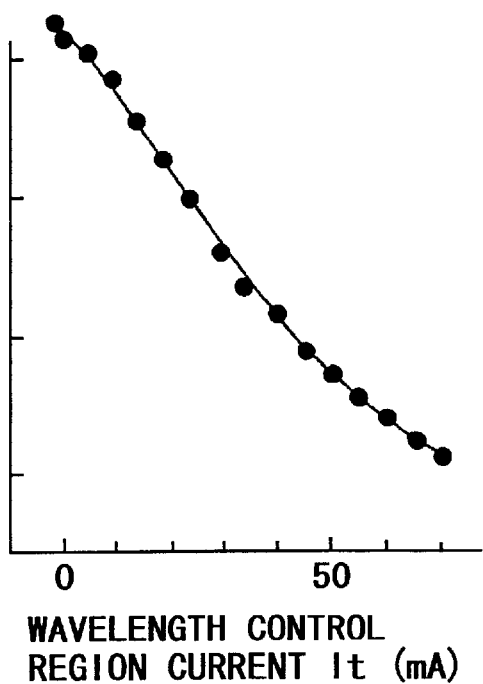
FIG. 4 includes a graph illustrating wavelength tunable characteristics of a DBR-DC-PBH semiconductor laser disclosed herein.

In FIG. 4, there is shown a relationship between the laser wavelength and the current $I_t$ inputted into a wavelength control region (phase control and DBR regions) of the semiconductor laser to change the frequency of the laser emission.

Although not linear as shown in FIG. 4, the relationship can be approximated by the following relation $$\lambda = \lambda_0 - C \cdot I_t, \tag{7}$$

where both $\lambda_0$ and C are constants. The current to be inputted is therefore expressed by $$I_t = 1/C\{\lambda_0 - 1/k \times \arctan(\tau t)\}. \tag{8}$$

When the current $I_t$ is inputed according to (8), a light beam scanning can be carried out at an approximately constant velocity at the photosensitive drum 11. However, care should be exercised, in that a correct control based on the relationship (8) is difficult to achieve, since the relation (7) is an approximation and already contains errors to some degree. This difficulty in achieving the beam scanning at a constant velocity is obviated as follows. First, by passing light beams which emerge from the photonic crystal onto a diffraction grating, first order diffracted beams are generated and subsequently detected by an optical position sensor such as, for example, a PSD. Results from the detection are then used for further corrections.

Although there may still exist some errors in detection with the optical sensor, such as position, and/or insufficient resolution, which may prevent a higher accuracy control, improvements can be made by further correcting with position sensors provided at both edges of the photosensitive drum. The locations of these position sensors are suitably selected depending on the parts arrangement in the system or apparatus. This method has an advantage, in that various errors caused before the position sensor can be corrected.

In the present method, when the wavelengths are detected, detected wavelength signals are compared with reference signals corresponding to λ's generated according to the relation (6), to find the difference therebetween. The thus found difference is subsequently used for the correction by generating and inputting the wavelength control region current $I_t$.

In addition, a further corrections can be made for errors originated from the relation between the wavelength and propagation angle within the photonic crystal. The correction due to the non-linear relationship can be carried out by compensating the reference signals, and the present is corrections due to the relation between wavelength and propagation angle can be corrected with position sensors provided at both edges of the photosensitive drum.

Several methods of laser beam control in general are described herein above. Control with a higher precision for the beam scanning system can be achieved by a combination of these methods.

A method is now detailed regarding detection of the laser beams and control of beam scanning utilizing the detection results. When this method is adopted, in which the laser beam is modulated according to information data, it is noted that the laser beam intensity should be sufficiently smaller than the sensitivity limit of the photosensitive drum, for the periods for which no recording or no imaging is made on the photosensitive drum.

It is also noted that, with conventional PSD's of relatively low costs, high S/N (signal-to-noise) ratios for the signal output may be difficult to obtain, especially at high frequency ranges. A further method can be considered, which uses a plurality of sensors arranged in series so as to increase apparent S/N ratios, but this can require a more complicated structure of the scan system.

In the method disclosed herein, in order to implement the required system capability even with detectors of relatively low S/N ratios, two photosensors are provided, one at each end of the photosensitive drum, and the outputs therefrom are utilized. That is, the scan period obtained from the time detected by respective sensors is used to find scanning errors to thereby make corrections.

When such errors are found during initial setting steps, corrections for the errors can be made immediately. However, when the errors are found during image forming steps onto the photosensitive drum, the correction is preferably carried out not for the next single line but for next several lines, gradually from one line to the next, so as to obviate irregularities in resultant images.

In order to scan the laser wavelength, a wavelength control region current $I_t$ is suitably inputted to the semiconductor laser. This operates as a feedforward portion in a control circuit, to thereby facilitate a decrease in the gain for a feedback circuit. That is, with this circuit configuration, accuracy can be improved over that of a feedback circuit having a comparable gain.

The position of laser beam scanning is detected by a PSD. After comparing the signal output from the PDS with reference signals generated to attain beam scanning at a constant velocity, the difference therebetween is found and subsequently corrected by inputting the laser wavelength correction current $\Delta I_t$ which corresponds to the above difference.

The laser wavelength correction current $\Delta I_t$ for the detected positional difference $\Delta x$ can be obtained as follows. First, from relations (2) and (8), $dI_t/dx$ is obtained as $$dI_t/dx = -L/\{kC(L^2 + x^2)\}. \tag{9}$$

This leads to $$\Delta I_t = -L/[kC\{L^2 + (vt)^2\}]\Delta x. \tag{10}$$

Subsequently, a coefficient β(t) is obtained for the difference $\Delta x$ found at the position $x = vt$, as follows.

$$\beta(t) = -L/[kC\{L^2 + (vt)^2\}]. \tag{11}$$

By multiplying β(t) by positional difference $\Delta x$, the laser wavelength correction current $\Delta I_t$ can therefore be obtained. This method, in which the value $\Delta I_t$ is obtained with respect to $\Delta x$ after calculating β(t) first, can help obviate fluctuations in control system gain. By this method, therefore, the control system circuit can remain stable without disturbances caused by the scanning system. That is, the control is achieved with high precision at any laser beam position during the scanning.

In order to smoothen the change in corrected change in wavelength, a smoothing circuit can be provided.

When a scanning step is initiated for the next line, the laser wavelength may show a step-wise change. In addition, in order for laser beam to return to the start point, the laser beam is scanned to the opposite or returning direction. Therefore, during the returning period, the output level of the laser power is preferably kept below the sensitivity level for the photosensitive drum. When returning is completed and the wavelength corresponding to the start position at that time is reached, another scan is initiated. Therefore, it is preferable to provide a waiting time period before entering the next scanning step. In order to reduce the waiting time and to obviate the laser power control issues described above, reciprocal scans can preferably be adopted. In order to attain higher speeds in the beam scanning, a multi-beam system can preferably be implemented by combining a plurality of the above described respective units or system.

In order to detect the wavelengths and feedback the resulting signals, a comparison is made between detected wavelength signals and reference signals generated according to the relation (6). Since the relationship between the wavelength and control current can be approximated by the linear relation (7), as described earlier, the wavelength control current $I_t$ can be inputted, accordingly.

Also in the present method, errors found in one line scan period are corrected through the reference signal correction by the signals outputted from position sensors provided at both edges of the photosensitive drum. In addition, in order to correct the differences caused by the non-linearity of the photonic crystal, a plurality of position sensors can be provided, not only at both edges but also at several in between positions of the photosensitive drum.

In this method, therefore, the scanning reference time is corrected based on the difference found between the time at respective position sensors and the predetermined reference time. That is, the reference time versus wavelength relation (6) is corrected by the plurality of position sensors. Two sets of side beams (or first order diffracted beams) from the diffraction grating, which is located behind the photonic crystal, are generated respectively over and below the sheet plane of FIG. 1, and either one of the sets serves as light incident on the respective position sensors. The distance of the position sensors from the sheet plane is determined considering the change in diffraction angles of the first order diffraction beams depending on the wavelength.

Although the relations (5) and (7) are assumed to be linear in the description above, they are non-linear in fact, as indicated earlier. These relations are therefore implemented in practice with corrections which are provided experimentally through reference signals and correction factors.

The following example is provided to further illustrate preferred but non-limiting embodiments.

EXAMPLE

Figure 2:
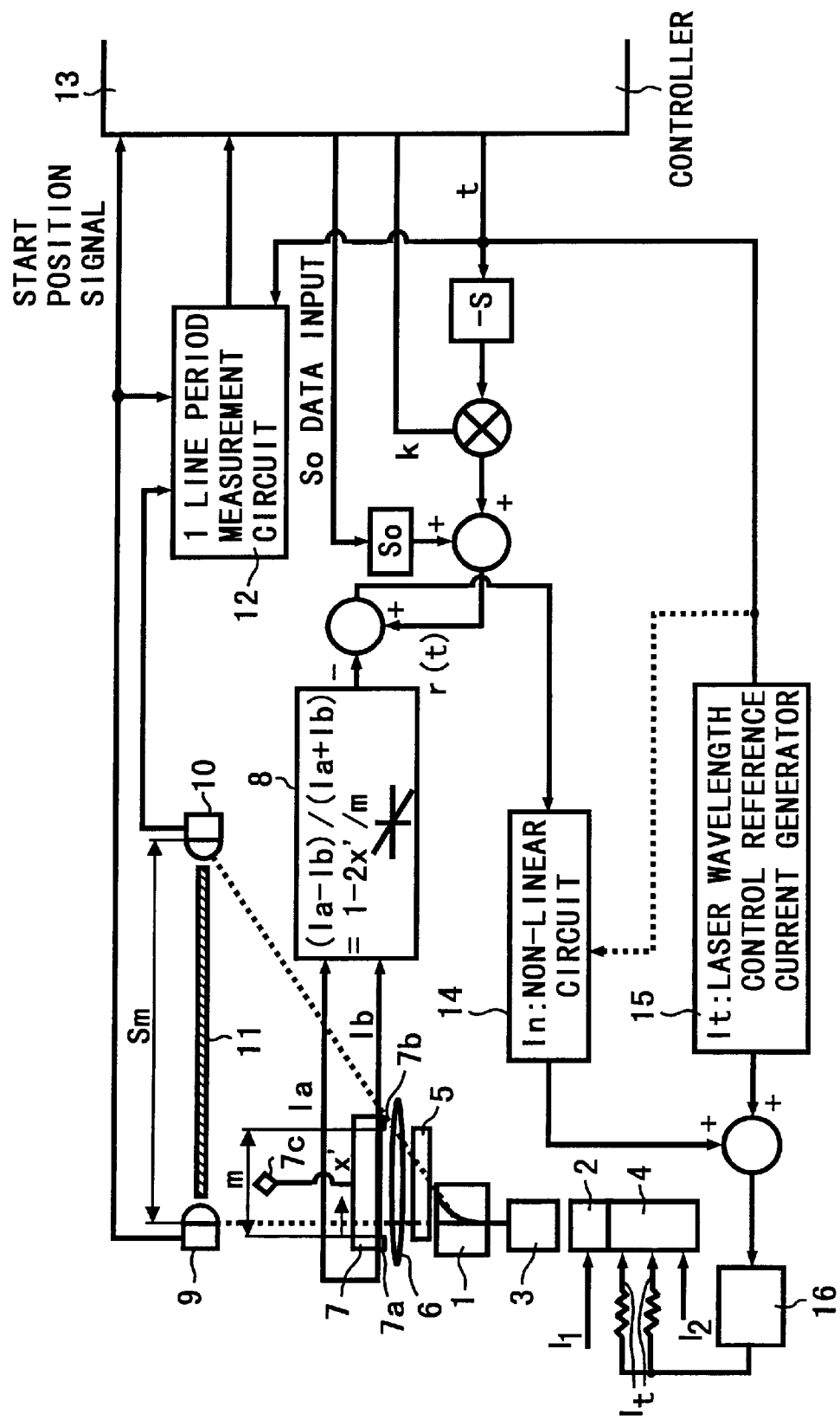
FIG. 2 is a schematic view illustrating the laser beam scanning system including a control system according to one embodiment disclosed herein.

FIG. 2 is a schematic view illustrating a laser beam scanning system including a control system according to an embodiment disclosed herein.

Referring to FIG. 2, the laser beam scanning system comprises a photonic crystal 1, an electric field absorption integrated modulator 2, a collimator lens 3, a wavelength tunable laser 4, a grating 5, an aspherical lens 6, a PSD (position sensitive detector) 7, first and second electrodes 7a and 7b, a common electrode 7c, a beam position measurement circuit 8, a start position sensor 9, a finish (end) position sensor 10, the surface of a photosensitive drum 11, a one-line time measurement circuit 12, a controller 13, a non-linear circuit 14, a wavelength control reference current generator 15, and a smoothing and LD drive circuit 16.

In addition, a modulation current, an active region current and a wavelength control region current are represented by $I_1$, $I_2$ and $I_t$, respectively.

With the system shown in FIG. 2, laser beam scanning is carried out with respect to the beam position detected by the PSD 7.

The wavelength adjustable laser 4 disclosed herein can be wavelength tunable DBR-DC-PBH (distributed Bragg reflector-double channel-planar buried heterostructure) semiconductor laser, and an electric field absorption modulator 2 is provided on the exit side of the laser beam. An active region current $I_2$ determines the power of laser emission, while a wavelength control region current $I_t$ controls the wavelength of the laser emission. Also, a modulation current $I_1$ controls the amplitude of the light output or the intensity of laser emission, to be utilized for forming electrostatic images on the surface of a photoreceptor, in that the amount of electrostatic charges on the surface of a photosensitive drum 11 is controlled through the laser beam irradiation.

As mentioned above, the formation of electrostatic images is based on the change in the amount of charges on the respective positions of the photoreceptor. This is caused, in turn, by the change in the amount of charge leakage, which increases with increasing laser beam irradiation.

A modulation current $I_1$ is inputted with time, i.e., clock signal, corresponding to image data provided. A collimator lens 3 is provided on the beam exit side of an electric field absorption modulator 2 to collimate diverging light beams into parallel beams. The laser beams are then incident on a photonic crystal 1, in which the angle of propagation varies depending on the wavelength. Laser beams emerged from photonic crystal 1 are subsequently incident onto a grating 5.

During the propagating of the laser beams through the grating 5, side beams (or the first order diffracted beams) are generated to be lead to a linear PSD 7, while non-diffracted or zero-order beams are incident on the surface of a photosensitive drum 11. An aspherical lens 6 is provided between the PSD 7 and the grating 5 for the laser beams incident onto position detecting portions of the PSD 7, so that the positions corresponding to laser scanning width $S_m$ of the zero-order laser beams are adequately detected by the PSD 7.

The angle and position of the PSD 7 are suitably selected considering the possible change in the diffraction angle due to the wavelength change.

When the distance from the first electrodes 7a to the position of beam incidence is taken as x', the inter-electrodes distance (the distance from the first electrodes 7a to the second electrode 7b) as m, and currents as $I_a$ and $I_b$, outputted from the electrodes 7a and 7b, respectively and when an arithmetic operation $(I_a-I_b)/(I_a+I_b)$ is made by a beam position measurement circuit, signals are obtained that are proportional to $(1-2x'/m)=<x>$. The present embodiment is configured to output the scanning position detection signal $<x>$ by the beam position measurement circuit 8.

In order for the laser beams be scanned at a constant velocity on the surface area of the photosensitive drum 11, reference signals $r(t)=S_0-\kappa Sxt$ are generated to be compared with the scanning position detection signals $<x>$, where S and $S_0$ are constants, and $\kappa$ is a correction factor. In addition, S is determined to satisfy the relation $S=2v/S_m$. For generating the reference signals r(t), $\kappa=1$ is assumed together with $S_0=1$, at the beginning.

Subsequently, reference signals r(t) and detection signals $<x>$ are compared with each other to find errors $\Delta\epsilon$ which are utilized for the laser beam position x be controlled to be brought to a proper position expected by the reference signals, which is achieved by changing the laser wavelength.

In addition, when the aforementioned positional errors $\Delta x$ are found, corrections for the errors can be made stably by inputting laser drive correction currents $\Delta I_1$ according to the relations (10) and (11).

Since the relation between position detection signals <x> and the above-mentioned errors $\Delta \epsilon$ is obtained as $\Delta x = -S_m / 2 \times \Delta \epsilon$, laser drive correction current $\Delta I_1$ is given by the relation $$\Delta I_1 = S_m \cdot L / [2kC\{L^2+(vt)^2\}]\Delta \epsilon. \quad (12)$$

When the errors $\Delta \epsilon$ are detected, therefore, the non-linear circuit 14 outputs values for $I_n = S_m \cdot L/[2kC\{L^2+(vt)^2\}]$ at time t corresponding to the scanning position to subsequently obtain the correction currents $\Delta I_1$ by further multiplying by $\Delta \epsilon$.

The above feedback system is constructed such that control be achieved through the positional error correction, which is achieved, in turn, by a feedforward control with the reference current generator for wavelength control 15. The laser wavelength control reference currents $I_1$ are generated herein according to the relation (8). In other words, the control of the laser scanning position is carried out by the wavelength control reference current generator 15 and positional errors resulting from the control are further corrected by the above feedback system.

Even after those corrections are made, several differences may exist, such as, for example, regarding the start position and period for the laser beam scanning. These differences can be corrected by providing a start position sensor 9 and a finish position sensor 10, to detect the start and finish points respectively, for the laser beam scanning operation.

In order to define the start point for the laser scanning, an ideal $S_0$ constant is assumed and the output from the wavelength control reference current generator 15 and an initial value of the non-linear circuit 14 are both adjusted to correspond to values at t=0.

At the same time, the output from the start position sensor 9 is inputted to the controller 13 to find whether any difference exists. As a result, when the beam position is found to deviate from the start point towards the direction opposite to the finish point, the constant $S_0$ is decreased gradually to adjust the laser beam position to the start position. Since no signal is detected from the start position sensor 9 with the present construction of the system, the controller 13 is capable of detecting that the beam position deviates away from the start point towards the direction opposite to the finish point, as mentioned just above.

Namely, the start position sensor 9 is configured to output signals when the beam position is found to move from the start point toward the finish point. After considering several errors from various origins, this system constructed to be referred to the aforementioned ideal $S_0$.

In addition, the PSD 7 is situated so as to detect the laser beam deviated from the start position, as described above.

Once the constant $S_0$ is found corresponding to the start point, correcting steps for the scanning period are then carried out. With the correction factor $\kappa=1$ and the above defined $S_0$ constant, laser beam are scanned. During the scanning, a period measured by the one-line time measurement circuit 12 is compared with that of a predetermined or desired scanning period. When the former (or measured period) is larger than the latter, the factor $\kappa$ is increased; while, when the former is smaller, the factor $\kappa$ is decreased. The scanning period can thus be adjusted so as to result in the predetermined value.

It is noted that caution is necessary regarding the width of the laser beam detection using the PSD 7.

The PSD 7 is configured in the present embodiment to be able to detect at least up to the beam direction which corresponds to the incidence onto the finish position sensor 10, even inclusive of several errors from various origins. When any error during continuous line scanning is found in either start position or scanning period, corrections can be achieved by changing the value of $S_0$ and/or $\kappa$. In addition, in order to obviate irregularities in resultant images, the corrections can preferably be made gradually over next several lines, from one line to the next.

In order to achieve higher scanning speeds, reciprocating scans may preferably be adopted, in which reference signals r(t-T) are generated for the return scans in place of r(t) for the period from 0 to T. In a similar manner, the generation of both $I_n$ and $I_t$ currents are also achieved by replacing t with t-T.

A plurality of filter circuits (not shown in FIG. 2) can be provided, such as, for example, one for filtering signals in the frequency range unusable for the present control and one for stabilization or stationary error reduction. They can preferably be included following the non-linear circuit 14.

In addition, an optical system (not shown) can also be incorporated to produce beam images focused on photosensitive drum 11, which is constituted by additionally providing appropriate components such as, for example, a cylindrical lens at an appropriate location.

Although an enhancement by a photonic crystal in deflection angle for light beam propagation is utilized in the present embodiment, it should be understood that any device or unit having similar characteristics can be used to achieve results comparable to those from the photonic crystal.

Furthermore, when the wavelength of the tunable laser is in the long wavelength region (1 $\mu$m or larger), for which a photoreceptor may not be sensitive enough to produce electrostatic images, the longer wavelength may suitably be converted to shorter wavelengths by wavelength conversion such as, for example, a second harmonic generation (SHG) device, to subsequently be incident on the photonic device.

It is apparent from the above description including the examples, that a laser beam with the present beam scanning system can be used for scanning over the surface area of a body to be scanned. This beam scanning system can be constructed with reduced size, power consumption, costs and operation noise, and can achieve excellent image quality and high scan speeds. By providing more than one photonic crystal, the laser beam deflection angle can be increased to facilitate the construction of a scanner having a scanning system that is even smaller.

In addition, non-linearities found in the wavelength versus scanning beam position relation are suitably corrected with position sensors provided at both ends, and in between positions, of the beam scanning range on the photosensitive drum. With this configuration of the position sensors, the above-mentioned non-linearities are compensated, and also beam scanning with high precision becomes feasible.

Additional modifications and variations of the present system and method are possible in light of the above teachings. It is therefore to be understood that within the scope of the appended claims, the invention may be practiced other than as specifically described herein by way of non-limiting examples.

This document claims priority and contains subject matter related to Japanese Patent Application No. 11-248877, filed with the Japanese Patent Office on Sep. 2, 1999, the entire contents of which are hereby incorporated by reference.

What is claimed is:

1. A laser beam scanning system comprising:
    a wavelength tunable laser for emitting a laser beam having tunable wavelengths;

at least one photonic crystal for receiving the laser beam emitted from said wavelength tunable laser, deflecting the laser beam during propagation thereof within said at least one photonic crystal, at an angle depending on the wavelength of the laser beam, and emitting the deflected laser beam at various angles of emission corresponding to the angle deflected in said photonic crystal; and at least one wavelength measurement device comprising a photonic crystal for receiving energy from said laser beam and outputting wavelength measurement signals to be fed into a feedback circuit to correct the wavelengths of the laser beam emitted from said wavelength tunable laser through control by said feedback circuit.

2. The laser beam scanning system according to claim 1, wherein:

said wavelength tunable laser is a wavelength tunable DBR-DC-PBH (distributed Bragg reflector-double channel-planar buried heterostructure) semiconductor laser.

3. The laser beam scanning system according to claim 1, further comprising:

an electric field absorption integrated modulator provided on a beam exit side of said wavelength tunable laser.

4. The laser beam scanning system according to claim 1, further comprising:

at least one optical position sensor for outputting position sensing signals to be fed into a feedback circuit so as to correct the wavelengths of the laser beam emitted from said wavelength tunable laser through the control by said feedback circuit.

5. The laser beam scanning system according to claim 4, further comprising:

a start position sensor for detecting a starting position of said laser beam in a scan thereof; and a finish position sensor for detecting a finish position of said laser beam in said scan, said start and finish position sensors being located at respective predetermined positions within a range of the laser beam scanning, for outputting respective detection signals to be fed into said feedback circuit to correct the wavelengths of the laser beam emitted from said wavelength tunable laser through control by said feedback circuit.

6. The laser beam scanning system according to claim 5, further comprising:

at least one additional position sensor located at one or more predetermined positions within the range of the laser beam scanning for outputting additional detection signals to correct the wavelengths of the laser beam emitted from said wavelength tunable laser.

7. The laser beam scanning system according to claim 1, wherein:

said deflecting the laser beam causes reciprocating scanning of the laser beam.

8. The laser beam scanning system according to claim 1, further comprising:

a non-linear circuit correcting the wavelength of the laser beam in a predetermined manner, by at least one of feedforwarding related to a relationship between a laser control current and a reference scanning time for maintaining a predetermined laser beam scanning, and a feedback to control the laser beam wavelength of said wavelength tunable laser.

9. The laser beam scanning system according to claim 1, wherein:

said laser beam scans in scan periods and corrections related to measurement, found during one scan period are carried out gradually over several succeeding scan periods to obviate irregularities in resultant images.

10. A laser beam scanning system comprising a first device for varying angles of emission for a light beam, further comprising:

at least one photonic crystal for receiving the light beam emitted from said first device and emitting the received light beam at various angles of emission for scanning over a surface area of a body to be scanned; and at least one wavelength measurement device comprising a photonic crystal for receiving energy from said light beam and outputting wavelength measurement signals to be fed into a feedback circuit to correct a wavelength of the light beam emitted from said first device through control by said feedback circuit.

11. A laser beam scanning system comprising:

means for emitting a laser beam having tunable wavelengths;

means for receiving the laser beam emitted from said means for emitting the laser beam, deflecting the received laser beam at an angle depending on the wavelength of the laser beam, and emitting the deflected laser beam at various angles of emission corresponding to the angle deflected; and at least one wavelength measurement device comprising a photonic crystal for receiving energy from said laser beam and outputting wavelength measurement signals to be fed into a feedback circuit to correct the wavelengths of the laser beam emitted from said means for emitting through control by said feedback circuit.

12. The laser beam scanning system according to claim 11, further comprising:

electric field absorption integrated modulator means.

13. The laser beam scanning system according to claim 11, further comprising:

means for generating and outputting position sensing signals to be fed into said feedback circuit to correct the wavelengths of the laser beam emitted from said means for emitting the laser beam through control by said feedback circuit.

14. The laser beams scanning system according to claim 13, further comprising:

means for detecting a start position for laser beam scanning; and means for detecting a finish position for laser beam scanning, said detecting means being located at respective predetermined positions within a range of the laser beam scanning, for outputting respective detection signals to be fed into said feedback circuit to correct the wavelengths of the laser beam emitted from said means for emitting the laser beam through control by said feedback circuit.

15. The laser beam scanning system according to claim 11, further comprising:

means for outputting additional detection signals located at another predetermined position within the range of the laser beam scanning to correct the wavelengths of the laser beam emitted from said means for emitting the laser beam.

16. The laser beam scanning system according to claim 11, further comprising:

means for feedforwarding depending on a relation between a laser control current and a reference scanning time for maintaining a predetermined laser beam scanning; and means for feedbacking to control the laser beam wavelength to said means for emitting the laser beam.

17. A laser beam scanning system comprising first means for varying angles of emission of a light beam, further comprising:

means for receiving the light beam emitted from said first means, and emitting the received light beam at various angles of emission to scan the laser beam over a surface area of a body to be scanned; and at least one wavelength measurement device comprising a photonic crystal for receiving energy from said light beam and outputting wavelength measurement signals to be fed into a feedback circuit to correct a wavelength of the light beam emitted from first means through control by said feedback circuit.

18. An image forming system comprising at least:

a wavelength tunable laser emitting a laser beam having a tunable wavelength;

at least one photonic crystal receiving energy from said laser beam emitted by the tunable laser and deflecting said energy at a deflection angle related to said tunable wavelength to produce a scanning laser beam at an emission angle related to said deflection angle;

an image forming surface scanned by said scanning laser beam; and at least one wavelength measurement device comprising a photonic crystal for receiving energy from said laser beam and outputting wavelength measurement signals to be fed into a first feedback circuit to correct the wavelengths of the laser beam emitted from said wavelength tunable laser through control by said first feedback circuit.

19. An image forming system as in claim 18 in which said wavelength correction circuit further includes at least:

position sensors detecting energy from said scanning laser beam at selected positions and providing position signals; and a second feedback circuit coupled to said position sensors and said tunable laser to correct said tunable wavelength depending at least on said position signals.

20. An image forming system as in claim 19 in which said position sensors are located at least at a starting position of a scan of said scanning beam and a finish position of said scan.

21. An image forming system as in claim 20 in which said position sensors are further located at least at one position intermediate said start and finish positions.

22. An image forming system as in claim 21 including a smoothing circuit coupled to said first and second feedback circuits and said tunable laser to spread over several scans wavelength corrections resulting from at least one of said wavelength detection signals and said position signals resulting from measurements made for a given scan of said scanning laser beam.

23. An image forming method comprising at least:

driving a wavelength tunable laser to cause the emission therefrom of a laser beam having a tunable wavelength;

directing energy from the laser beam emitted by the tunable laser to at least one photonic crystal deflecting said energy at a deflection angle related to said tunable wavelength to thereby produce a scanning laser beam at an emission angle related to said deflection angle;

directing energy from said scanning laser beam to an image forming surface; and receiving via a photonic crystal energy from said laser beam and outputting wavelength measurement signals to be fed into a feedback circuit to correct the wavelengths of the laser beam emitted from said wavelength tunable laser through control by said feedback circuit.

24. An image forming method as in claim 23 further including:

detecting energy from said scanning laser beam at selected positions and providing position signals: and correcting the tunable wavelength by controlling the tunable laser depending at least on said position signals.

25. An image forming method as in claim 24 in which said detecting at selected positions comprises detecting at least at a starting position of a scan of said scanning beam and at a finish position of said scan.

26. An image forming method as in claim 25 in which said detecting at selected positions further comprises detecting at least at one position intermediate said start and finish positions.

27. An image forming method as in claim 26 further comprising spreading over several scans wavelength corrections resulting from at least one of said wavelength detection signals and said position signals resulting from measurements made for a given scan of said scanning laser beam.

* * * * *